United States Patent [19]

Thompson

[11] 4,278,422

[45] Jul. 14, 1981

[54] DIFFUSION TUBE SUPPORT COLLAR

[75] Inventor: David L. Thompson, Orange, Calif.

[73] Assignee: David M. Volz, Santa Ana, Calif.

[21] Appl. No.: 108,553

[22] Filed: Dec. 31, 1979

[51] Int. Cl.³ .................. F27B 7/00; B65D 53/00; F02F 11/00

[52] U.S. Cl. .................. 432/188; 277/229; 277/230; 432/253

[58] Field of Search ........... 432/3, 188, 198, 210, 432/253; 277/229, 230

[56] References Cited

U.S. PATENT DOCUMENTS

| 2,372,946 | 4/1945 | Foster et al. | 432/3 |
| 2,667,804 | 2/1954 | Boyer et al. | 277/230 X |
| 3,183,130 | 5/1965 | Reynolds et al. | 432/253 |
| 3,604,694 | 9/1971 | Muller | 432/253 |
| 4,156,533 | 5/1979 | Close | 277/299 |

Primary Examiner—John J. Camby
Attorney, Agent, or Firm—Jackson, Jones & Price

[57] ABSTRACT

A collar for supporting and positioning a diffusion tube in a furnace used in the manufacture of semiconductors, integrated circuits and the like, is disclosed. The collar has a resilient core and an outer cover enclosing the core. The core and the cover are made of materials which readily withstand the normal operating temperatures of the furnace. The collar is dimensioned to tightly fit around a circumference of the diffusion tube, and to fit within an aperture provided in a support block of the furnace. The collar permits precise positioning of the diffusion tube relative to a helical heating coil provided in the furnace.

16 Claims, 4 Drawing Figures

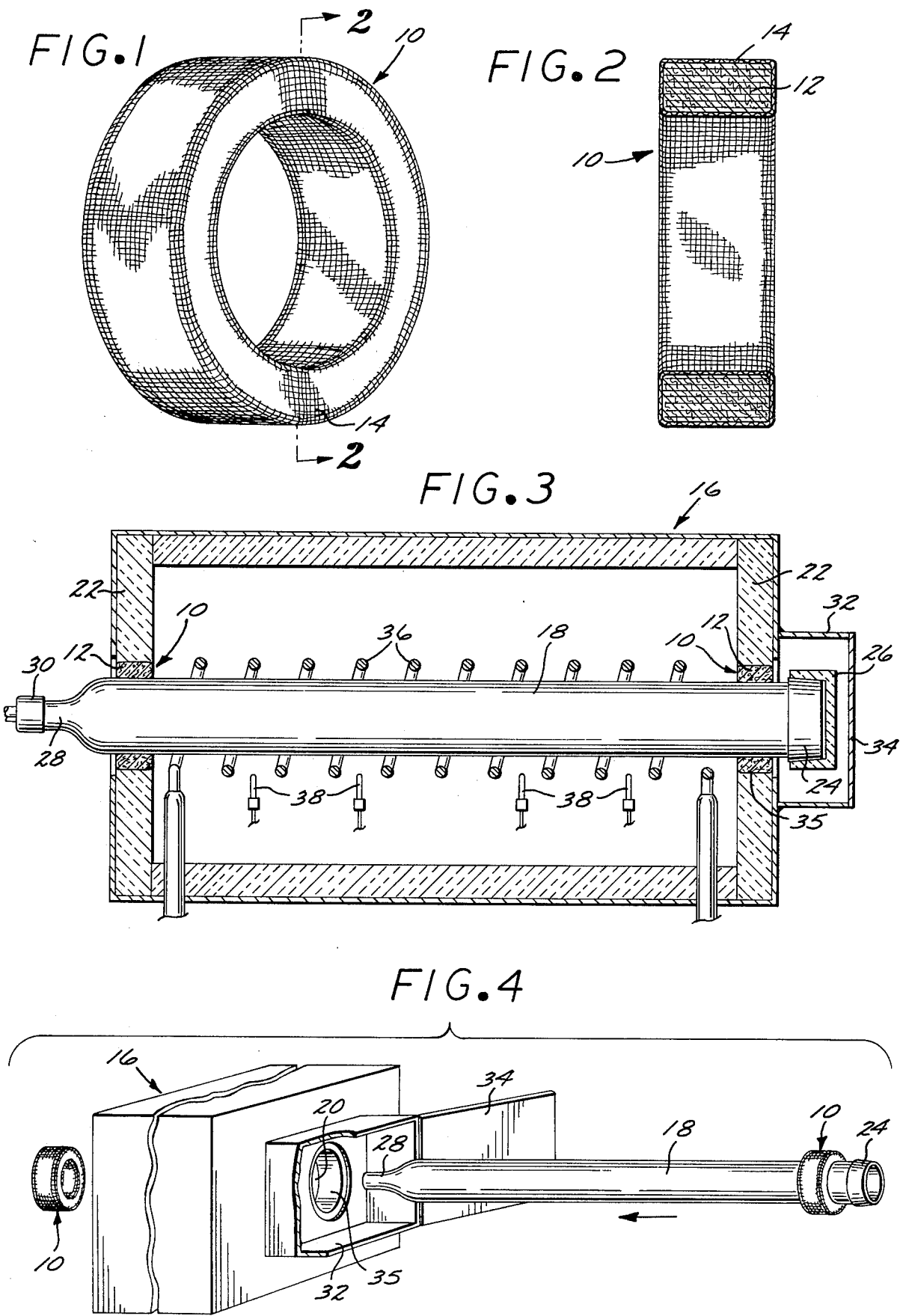

DIFFUSION TUBE SUPPORT COLLAR

BACKGROUND OF THE INVENTION

1. Field of the Invention

The present invention is directed to a support member adapted for positioning and supporting a diffusion tube while the diffusion tube is heated in a furnace as a step in the process of manufacturing semiconductors, integrated circuits and the like. More particularly, the present invention is directed to a support collar capable of supporting a diffusion tube within a furnace and of positioning the diffusion tube relative to heating coils contained in the furnace.

2. Brief Description of the Prior Art

The overall process of manufacturing semiconductors, integrated circuits and like devices includes a step wherein certain intermediate products of the process are heated at approximately 1000°–1200° C. for a ¼–4 hour time period. This step is commonly referred to in the art as a diffusion step because in this step certain gases usually present in small quantities in an inert carrier gas, diffuse into the material of the semiconductors, integrated circuits and the like. After diffusion and under exposure to heat, the gases decompose to yield such products as elemental boron or arsenic. As is well known in the art, presence of trivalent boron, or pentavalent arsenic in the tetravalent silicon material of the semiconductors is principally responsible for the desirable electrical characteristics of these devices.

During the diffusion or like process the intermediates of the process, commonly referred to in the trade as wafers, are enclosed in a quartz diffusion tube which is heated in a furnace. The diffusion tube usually is slightly longer than the furnace. It is usually supported by support blocks which are located adjacent to oppositely disposed walls of the furnace. Ends of the diffusion tube are located outside of the furnace and are respectively provided with a suitable cap and a suitable gas inlet attachment. The support blocks are usually made of a heat resistant silicon dioxide based material and are commonly referred to in the art as vestibule blocks.

Other steps in the overall process of manufacturing semiconductors integrated circuits and the like which require identical or similar equipment and the use of the diffusion tube in the furnace, include oxidation, polycrystalline and amorphous silicon deposition and the like.

According to present practice in the art, a circular hole or aperture is provided in each of the two oppositely disposed vestibule blocks. The apertures are aligned with one another and are somewhat larger in diameter than the diffusion tube. The diffusion tube is inserted into the furnace through one of the two apertures and is held in position relative to the furnace by the walls surrounding the two apertures. A helically wound heating element or coil is positioned in the furnace to provide and maintain a high temperature therein. A longitudinal axis of the helical heating coil is aligned with the center of the apertures provided in the vestibule blocks. Consequently, when the diffusion tube is operatively positioned within the furnace, it is surrounded by the heating coil although it is not in physical contact therewith.

It is important to position the diffusion tube precisely centered along the longitudinal axis of the heating coil. This is necessary in order to obtain substantially even heating of the entire cylindrical periphery of the diffusion tube and to cause the diffusion and chemical decomposition process to proceed at an even velocity at all points inside the diffusion tube. Furthermore, when the diffusion tube is correctly centered within the helical coil a temperature profile or distribution is obtained along the length and around the periphery of the tube which even if not perfectly uniform, is reproducible. In other words, it is highly desirable that after the diffusion tube is removed from the furnace and is subsequently repositioned therein, the same temperature profile be obtained. This requirement is well appreciated by those skilled in the art. As is described in somewhat more detail below, the state of the art however falls short of achieving the above described objectives.

According to current practice, a heat resistant substantially loose packing material is placed to fill a gap between the diffusion tube and walls of the apertures provided in the vestibule blocks. As the gap is manually filled with the packing material an attempt is made to center the diffusion tube relative to the helical heating coil. The packing material used for this purpose is, of course capable of withstanding the high temperatures used in the furnace. Packing materials currently used for this purpose include rock wool and a high melting glass wool. Both of these materials contain a large percentage of silicon dioxide which principally accounts for their resistance to high temperature. Rock wool is often known in the art under the tradename "K Wool".

The practice of packing rock wool or glass wool around the diffusion tube to support and center the tube relative to the apertures of the vestibule blocks, however suffers from the following serious disadvantages. Manually applying the packing material into the gaps is time consuming and therefore expensive. It is virtually impossible to truly center the diffusion tube relative to the helical heating coil. Furthermore, after the diffusion tube is removed from the furnace for cleaning or other purposes it is virtually impossible to reposition the diffusion tube relative to the helical coil in the same manner as it was previously positioned. It is very difficult to fully close the gap between the diffusion tube and the vestibule block so as to eliminate minor air currents or convections through the packing material. Finally, the packing material readily crumbles and gives rise to dust and airborn particulate matter. This particulate matter and dust has a serious deleterious effect in the diffusion process in that a relatively large number of semiconductors or integrated circuits are often completely ruined by particles which settle on the intermediates during the manufacturing process. Identical or similar problems are present when intermediates of the semiconductors or integrated circuit manufacturing process are subjected to the oxidation, polycrystalline and amorphous silicon deposition and the like steps in the above described furnace.

Thus the practice of supporting and aligning the diffusion tubes relative to the vestibule blocks with the help of loose packing material such as rock or glass wool, results in economically undesirable lost or "down" time in the utilization of the furnace, and in many ruined semiconductors and integrated circuits. The diffusion tube support collars of the present invention are designed to overcome these disadvantages.

SUMMARY OF THE INVENTION

It is an object of the present invention to provide a support collar for a diffusion tube which is easily and rapidly positioned in a gap between the diffusion tube and walls of an aperture provided in a vestibule block of a furnace used in the process of manufacturing semiconductors, integrated circuits and the like.

It is another object of the present invention to provide a support collar for diffusion tube used in the process of manufacturing semiconductors, integrated circuits and the like, which permits accurate positioning of the diffusion tube relative to heating coils of a furnace.

It is still another object of the present invention to provide a support collar for a diffusion tube used in the process of manufacturing semiconductors, integrated circuits and the like which permits reproducible positioning of the diffusion tube relative to the heating coils of a furnace.

It is yet another object of the present invention to provide a support collar for diffusion tube used in the process of manufacturing semiconductors, integrated circuits and the like which minimizes undesirable air currents in a furnace while the diffusion or like step is in progress.

It is still a further object of the present invention to provide a support collar for a diffusion tube which reduces the amount of contaminating particulate matter in the vicinity of a furnace wherein intermediates of semiconductors, integrated circuits and the like are processed.

These and other objects and advantages are attained by a support collar which is adapted for supporting a diffusion tube in an aperture provided in at least one vestibule block of a furnace wherein steps of diffusion or the like are performed in the process of manufacturing semiconductors, integrated circuits and the like. The support collar includes a resilient core and an outer cover or sheath enclosing the core. The core and the cover are manufactured from materials which are capable of withstanding the normally high operating temperatures of the furnace. The support collar is dimensioned to tightly fit around the outer circumference of the diffusion tube, and to also fit within the aperture of the vestibule block.

The objects and features of the present invention are set forth in the appended claims. The present invention may be best understood by reference to the following description, taken in connection with the accompanying drawings in which like numerals indicate like parts.

BRIEF DESCRIPTION OF THE DRAWINGS

FIG. 1 is a perspective view of a preferred embodiment of the diffusion tube support collar of the present invention;

FIG. 2 is a cross sectional view of the preferred embodiment of the diffusion tube support collar of the present invention, the cross section being taken at line 2—2 of FIG. 1;

FIG. 3 is a schematic cross sectional view of a furnace wherein a diffusion tube is supported by the preferred embodiment of the diffusion tube support collar of the present invention, and FIG. 4 is a schematic perspective view showing the placement of the preferred embodiment of the diffusion tube support collar of the present invention upon a diffusion tube prior to insertion of the diffusion tube into a furnace.

DESCRIPTION OF THE PREFERRED EMBODIMENT

The following specification taken in conjunction with the drawings sets forth the preferred embodiment of the present invention. The embodiment of the invention disclosed herein is the best mode contemplated by the inventor for carrying out his invention in a commercial environment, although it should be understood that various modifications can be accomplished within the scope of the present invention.

Referring now to the drawing figures and particularly to FIGS. 1 and 2, a preferred embodiment of the diffusion tube support collar 10 of the present invention is disclosed. The support collar 10 has a core 12 and an outer cover or sheath 14 which completely encloses the core 12.

For the purposes of the present invention the materials comprising the core 12 and the cover 14 are critical only to the extent that they must have the following properties. The core 12 and the cover 14 must be able to withstand repeated exposure to high temperatures normally used in a furnace 16 wherein the diffusion or like step in the process of manufacturing semiconductors, integrated circuits (not shown) and the like is performed. The furnace 16 is schematically shown on FIGS. 3 and 4. For a brief description of the diffusion step, reference is made to the introductory part of this specification.

Generally, the furnace 16 operates in the 1000°–1200° C. temperature range. Therefore the materials of the core 12 and of the cover or sheath 14 must withstand this temperature. Furthermore, the core 12 must be resilient and somewhat flexible, while the cover or sheath 14 must be able to conform to the shape of the core 12.

It has been found in practice that a pressed or matted sheet of rock wool held together by a suitable heat resistant binder comprises an ideal material for the construction of the core 12. Such a sheet of rock wool is commercially available and can be readily obtained in a thickness of ½ of an inch.

A fabric woven of high melting point glass threads is ideally suited for the construction of the cover or sheath 14. The glass threads are often called in the trade "silica threads". The glass or silica threads comprise silicon dioxide based material which does not melt or soften significantly at the operating temperature of the furnace 16. The glass or "silica" threads are also readily available commercially.

A convenient method for manufacturing the support collar 10 of the present invention is to cut a ½" sheet of rock wool into a desired size, and to place the cut sheet within a matchingly dimensioned sheath or cover 14.

The sheath or cover may be sewn into a tube form (not shown) into which the rock wool sheet is inserted. A simple tool (not shown) comprising a plate having a slightly larger width than the width of the tube (not shown) of fabric may be used to facilitate insertion of the rock wool sheet into the tube (not shown). Thereafter the tube (not shown) is bent into the ring configuration shown on FIGS. 1 and 2, and adjoining edges are stiched to one another by a suitable high melting point glass thread. A support collar 10 of practically any desired diameter or dimension may be obtained in the above described manner. In order to minimize particulate matter loosely adhering to the support collar 10, the support collar 10 may be vacuum cleaned prior to use.

It is desirable for the purposes of practicing the present invention to provide a support collar 10 which fits tightly upon a diffusion tube 18 shown on FIGS. 3 and 4. Therefore an inner diameter of the support collar 10 is usually approximately ¼" less than an outer diameter of the cylindrically shaped diffusion tube 18. An outer diameter of the support collar 10 is usually approximately 3/16" larger than a diameter of an aperture 20 provided in a support or vestibule block 22 of the furnace 16. Mounting of the diffusion tube 18 in the furnace 16 with the aid of the support collar 10 of the present invention is described below in conjunction with a description of FIGS. 3 and 4.

In most instances, the support collar 10 of the present invention includes only one ½ inch thick matted sheet of rock wool. It has been found that this is usually sufficient to provide supportive cushion to the diffusion tube 18 and to permit exact positioning of the diffusion tube 18 in the furnace 16. In order to provide support to heavier and larger than usual diffusion tubes 18, a support collar 10 including two or more ½" thick matted sheets of rock wool laid on top of one another, may be manufactured.

Referring now to FIGS. 3 and 4, utilization of the support collar 10 of the present invention in the diffusion or like step in the process of manufacturing semiconductors, integrated circuits and the like, is disclosed. As it was briefly described above, in the diffusion or like steps, intermediate products of the manufacturing process for semiconductors are integrated circuits are heated in a carefully controlled gas atmosphere in a suitable furnace 16. More particularly, as a preliminary step, a quartz diffusion tube 18 is first placed into the furnace 16. The quartz diffusion tube 18 has a tapered precision ground matching cap 26. A narrow back end 28 of the diffusion tube 18 is adapted to receive a suitable gas inlet device 30. The cap 26 and the gas inlet device 30 are schematically shown on FIG. 3. A steel box 32 having a hinged door 34 is attached to the furnace 16. The steel box 32 is commonly referred to in the art as a vestibule box. Its purpose is to protect the front end 24 of the diffusion tube 18 while the actual diffusion or like process is in progress.

Two oppositely disposed support or vestibule blocks 22 are provided in the furnace 16. As it was described above the vestibule blocks 22 include the apertures 20 into which the diffusion tube 18 is inserted.

In order to position and support the diffusion tube 18 in the furnace 16 in accordance with the present invention, one support collar 10 is slid upon the diffusion tube 18 through its back end 28. Thereafter, the diffusion tube 18 is inserted into the furnace 16 through the aperture 40 which is adjacent to the vestibule box 32. This is schematically shown on FIG. 4. When insertion of the diffusion tube 18 is complete, the back end 28 of the diffusion tube 18 protrudes from the furnace 16 through another aperture 20, as is shown on FIG. 3. The support collar 10, which has been placed on the diffusion tube 10 is utilized to fill a gap between the tube 18 and walls 35 of the aperture 20 adjacent to the vestibule box 32. A second support collar 10, shown on FIG. 4 may be used in the same manner adjacent to the back end 28 of the diffusion tube 18.

With reference to FIG. 3 the support collars 10 are shown supporting the diffusion tube 18. The support collars 10 also permit the diffusion tube 18 to be substantially perfectly centered relative to a helically wound heating coil 36 and substantially seal the gap between the diffusion tube 18 and the walls 35 of the apertures 20. It follows from the above that the support collars 10 also permit substantially precise repositioning of the diffusion tube 18 relative to the heating coils 36 after the diffusion tube 18 is removed from the furnace 16 for purposes of cleaning or for some other reason.

By sealing the gap, the support collars 10 eliminate undesirable minor air currents entering through the apertures 20 and flowing in the furnace 16 around and along the diffusion tube 18. These air currents were consistent causes of trouble in the prior art and caused irreproducible temperature profiles along the length and circumference of the diffusion tube 18. Additionally, the support collars 10 eliminate troublesome dust and particulate matter which was unavoidably associated with use of loose packing material such as rock or glass wool in the prior art. Temperature sensing gauges 38 which measure the temperature profile or distribution along the length of the diffusion tube 18 in the furnance 16, are schematically shown on FIG. 3.

After the diffusion tube 18 is properly placed in position in the furnace 16, intermediate products (not shown) of the semiconductor or integrated circuit manufacturing process are placed into the diffusion tube 18. Thereafter, the cap 26 and the gas inlet device 30 are assembled to the respective front and back ends 24 and 28 of the diffusion tube 18, and the process of diffusion proper or a like process such as oxidation, polycrystalline and amorphous silicon deposition and the like is performed by introduction of a desired gas mixture into the diffusion tube 18. This is in accordance with standard practice in the art and need not be described here in further detail.

The diffusion tube support collars 10 of the present invention have a long useful life. By virtue of the above described technological advantages they provide a significant cost saving in the overall manufacturing process for semiconductors, integrated circuits and the like. Several modifications of the above described support collars may become readily apparent to those skilled in the art in light of the above disclosure. Accordingly, the scope of the present invention should be interpreted solely from the following claims.

What is claimed is:

1. An annular collar for supporting and positioning a diffusion tube in a furnace relative to the walls of the furnace, said furnace being used in the manufacture of semiconductors, integrated circuits and the like, the collar comprising:

a resilient core capable of withstanding high temperatures normally used in the furnace, and an outer resilient sheath covering the core and being made of a material capable of withstanding high temperatures normally used in the furnace, the collar being dimensioned to tightly fit around the circumference of a predetermined diffusion tube and to fit within an aperture provided in a support member of the furnace.

2. The invention of claim 1 wherein the resilient core comprises a silicon dioxide based material held together by a suitable binding agent.

3. The invention of claim 2 wherein the outer fabric sheath comprises a fabric woven from a silicon dixoide based thread.

4. The invention of claim 1 wherein the collar has an inside diameter approximately ¼" less than the outside diameter of the predetermined diffusion tube.

5. The invention of claim 4 wherein the collar has an outside diameter approximately 3/16" more than a diameter of the aperture provided in the support member of the furnace.

6. An annular support collar adapted for positioning and supporting a quartz diffusion tube in a substantially circular aperture provided in at least one vestibule block of a furnace adapted for performing a diffusion step in the manufacture of semiconductors, integrated circuits and the like, the support collar comprising:

a resilient core having at least one matted sheet comprised of a silicon dioxide based material, and an outer cover enclosing said core, the cover comprising a fabric made of silicon dioxide based threads, the collar being dimensioned to fit around the outer circumference of the diffusion tube and to also fit within the aperture of the vestibule block.

7. The invention of claim 6 wherein the core comprises rock wool material held together by suitable binder.

8. In the process of diffusion and like processes used in the manufacture of semiconductors, integrated circuits and the like wherein a diffusion tube is at least partially placed within a furnace of high temperature and subsequently intermediate products of said manufacture are placed in the diffusion tube, the improvement comprising the step of:

supporting the diffusion tube within the furnace with at least one annular heat resistant, resilient support collar, said collar tightly fitting the diffusion tube and also fitting within an aperture provided in a support block of the furnace.

9. The improvement of claim 8 further comprising the step of placing the support collar on the diffusion tube prior to placing the diffusion tube into the furnace.

10. The improvement of claim 9 comprising the steps of placing two support collars on the diffusion tube with each support collar being placed substantially adjacent to an end of the diffusion tube so as to support the diffusion tube within the furnace only by the two support collars.

11. The improvement of claim 10 wherein the support collar comprises a resilient core and a cover enclosing said core, the core and the cover both being made of material capable of withstanding temperatures approximately in the range of 1000°-1200° C.

12. The improvement of claim 8 wherein the support collar comprises a resilient core and a fabric cover enclosing the core, the core and the cover both being made of silicon dioxide based materials.

13. The improvement of claim 12 wherein the core comprises at least one matted sheet of rock wool and wherein the cover comprises a fabric woven from silicon dioxide based thread.

14. In a furnace used in a step of diffusion and like steps in the process of manufacturing semiconductors, integrated circuits and the like, said furnace normally operating at high temperature and having at least one support block incorporating an aperture, the combination which comprises:

a quartz tube adapted for placement into the furnace and for enclosing a plurality of intermediates of said process, and at least one resilient annular collar comprised of a heat resistant material capable of withstanding the high temperatures normally used in the furnace, the collar dimensioned to tightly fit around the outer periphery of the quartz tube and also to tightly fit in the aperture provided in the support block, the collar supporting the tube in the furnace.

15. The combination of claim 14 wherein the collar comprises a resilient core and an outer fabric cover for the core.

16. The combination of claim 14 wherein the collar has an inner diameter approximately $\frac{1}{4}$" less than an outer diameter of the quartz tube, and an outer diameter approximately 3/16" larger than a diameter of the aperture incorporated in the support block.

* * * * *